United States Patent [19]

Yamaga

[11] Patent Number: 4,954,079

[45] Date of Patent: Sep. 4, 1990

[54] HEAT-TREATING APPARATUS AND A METHOD FOR THE SAME

[75] Inventor: Kenichi Yamaga, Sagamihara, Japan

[73] Assignee: Tel Sagami Limited, Kanagawa, Japan

[21] Appl. No.: 395,645

[22] Filed: Feb. 3, 1989

[30] Foreign Application Priority Data

Feb. 5, 1988 [JP] Japan .................................. 63-25505

[51] Int. Cl.⁵ .............................................. F27D 5/00
[52] U.S. Cl. ........................................ 432/6; 432/253; 432/152
[58] Field of Search ...................... 432/5, 6, 9, 11, 152, 432/87, 253, 125, 153

[56] References Cited

U.S. PATENT DOCUMENTS

| 4,439,146 | 3/1984 | Sugita | 432/6 |
| 4,613,305 | 9/1986 | Sakurai | 432/6 |
| 4,669,938 | 6/1987 | Hayward | 432/253 |
| 4,752,219 | 6/1988 | Fisher, Jr. | 432/6 |
| 4,828,490 | 5/1989 | Indig | 432/253 |

Primary Examiner—Henry C. Yuen
Attorney, Agent, or Firm—Oblon, Spivak, McClelland, Maier & Neustadt

[57] ABSTRACT

According to this invention, a boat carried by an elevator is put on a boat supporting unit installed at a boat delivery position and capable of moving up and down and then, the boat is delivered from the boat supporting unit to transfer means for a heat-treating furnace. Therefore, boats can be transferred by the common elevator to the boat delivery positions at heat-treating furnace arranged in multiple stages. Even when heat-treating furnaces of different types are installed in multiple stages, boats can be transferred to those furnaces by using the common elevator. As a result, when boats to be sent to different types of furnaces arrive at the work position, for example, boats can be delivered to the furnaces with extremely high efficiency and by simple devices.

5 Claims, 9 Drawing Sheets

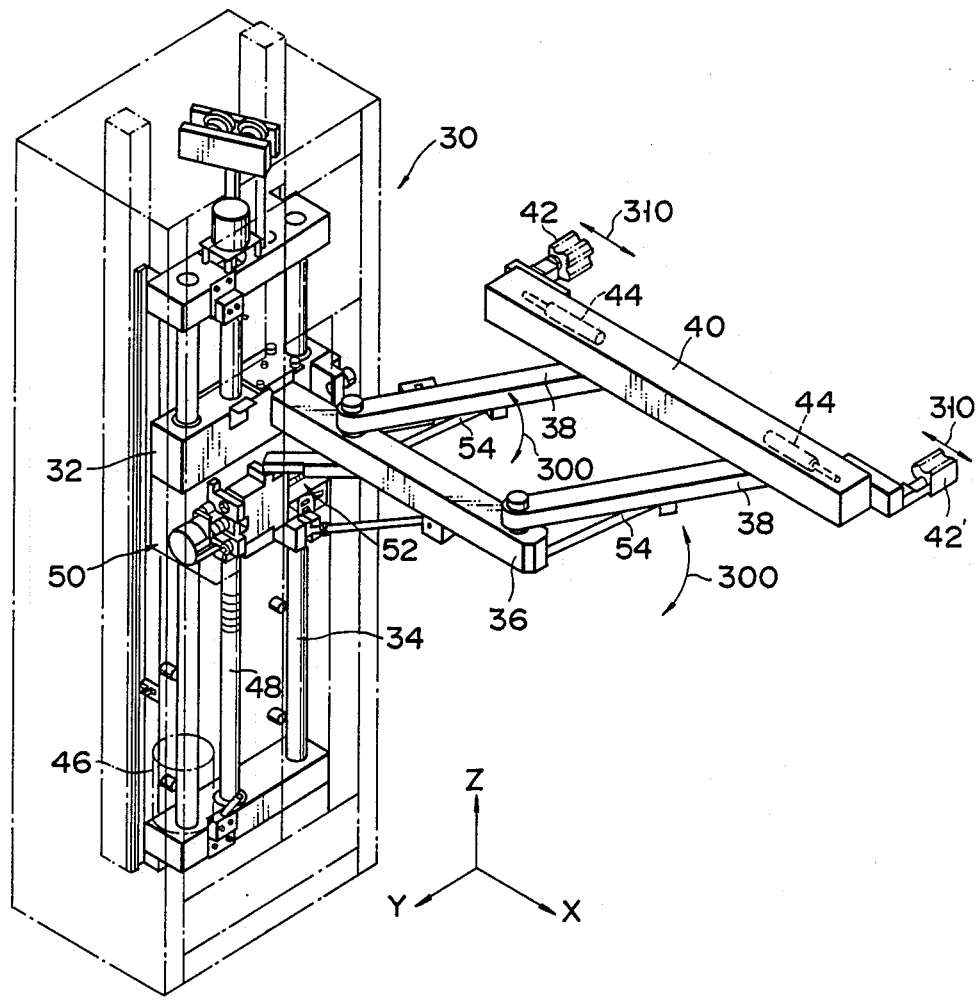
F I G. 7

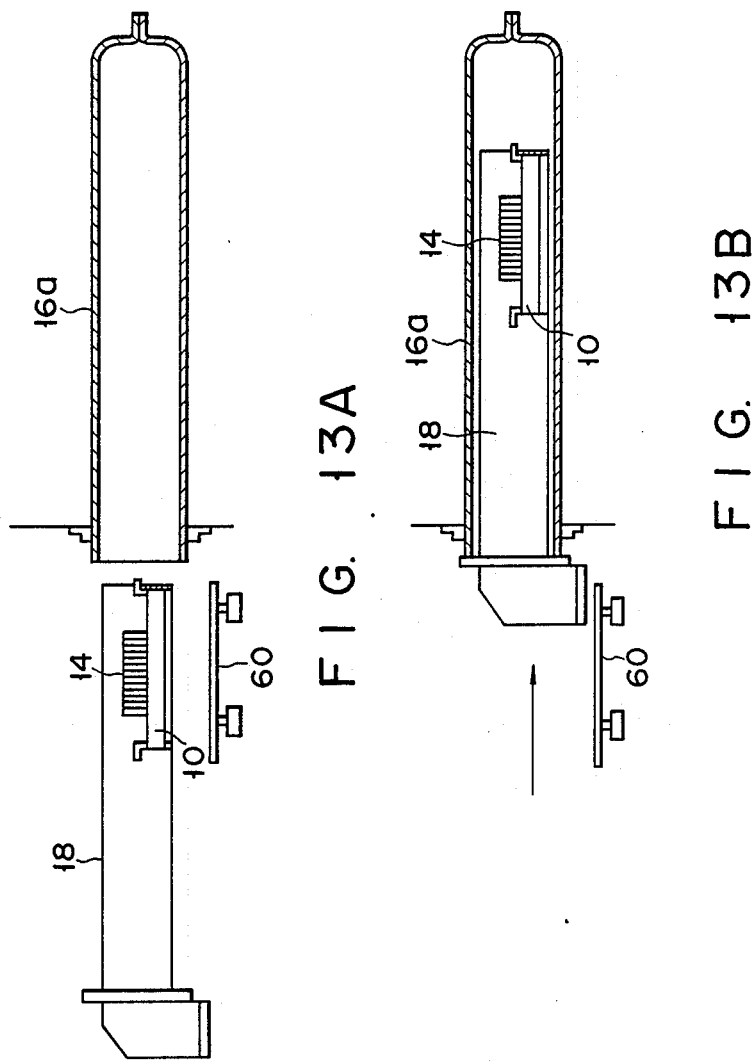

HEAT-TREATING APPARATUS AND A METHOD FOR THE SAME

BACKGROUND OF THE INVENTION

1. Field of the Invention

This invention relates to a heat-treating apparatus and a method for the same.

2. Description of the Prior Art

Heat-treating apparatus has been used for the manufacture of semiconductor devices. This manufacture includes diffusion treatment, forming of an oxide film and forming of a film by Chemical Vapor Deposition. Heat treatment by the heat-treating equipment is described in the following. A boat holding wafers subject to heat treatment is placed in the work position. The board which is holding, i.e., 50 wafers and is made of quartz is carried by an elevator to the boat delivery position of the heat-treating furnace. Then, the boat is transferred by transfer means directly from the elevator to the heat-treating furnace where the wafers are subjected to specified heat treatment.

There are various types of boat transfer means. Therefore, it is necessary to select boats and an elevator that suit the type of transfer means in order to allow the smooth transfer of boats to the transfer means.

For example, among the transfer means available on the market that bring a wafer into and out of the heat-treating furnace without the wafer being contacted by contaminants are the products called "Softlanding", "Cantilever" and "Atmoscan" made by Tel Sagami Co., Ltd.

In the "Softlanding" type, boat 10 that looks like a ship as shown in FIG. 1A is raised and carried by wafer transfer arm 12 called a fork as shown in FIG. 1B, one end of which is circular in cross section or by wafer transfer arm 12' called a fork as shown in FIG. 1C, one end of which is rectangular in cross section. As shown in FIG. 2, boat 10 holding wafers 14 is taken into heat-treating furnace 16 without physical contact with contaminants. After boat 10 is set in heat-treating furnace 16, transfer arm 12 is taken out of heat-treating furnace 16. Under this condition, wafers 14 receive heat treatment after shutting an entrance of the furnace 16.

In the "Cantilever" type transfer means, as in the "Softlanding" type, boat 10 is raised and held by transfer arm 12 or 12'. Then, wafers 14 are taken into heat-treating furnace 16 without contacting to wall of furnace 16. One difference from the "Softlanding" type is that wafers 14 are heat-treated with boat 10 still placed on transfer arm 12 or 12'.

As described above, both in the "Softlanding" and "Cantilever" transfer methods, transfer arm 12 or 12' is used to raise and carry boat 10. Hence, boat 10 is delivered at the boat delivery position as described below. Referring to FIG. 1B, there are handles 10a at the ends in the longitudinal direction of boat 10, which will be carried by an elevator. The elevator carrying boat 10 lowers in the direction indicated by the arrow mark $b_1$ and puts boat 10 on wafer transfer arm 12. The holding of handles 10a and 10b is then released. After this, the elevator is withdrawn upward as indicated by the arrow mark $b_2$. Thus, boat 10 has been delivered.

Meanwhile, in the "Atmoscan" transfer method, hollow, cylindrical transfer arm 18 is used as shown in FIG. 3. Transfer arm 18 is inserted into boat 10. Then, an inactive gas such as niytogen is introduced into transfer arm 18 as shown in FIGS. 4A and 4B. Wafers 14 are thereby prevented from being covered by an oxide film which is formed by reaction with oxygen in the air. Under this condition, transfer arm 18 is inserted into heat-treating furnace 16 where wafers 14 are heat-treated.

As described above, in the "Atmoscan" method, transfer ar 18 is formed in a hollow cylinder. Therefore, if boat 10 and an elevator of the same constructions as are used in the "Softlanding" and "Cantilever" methods are employed, it is impossible to deliver boat 10 into transfer arm 18 by means of the elevator. Consequently, an elevator is used which is constructed to support boat 10 from below and carry to the boat transfer position. This elevator inserts boat 10 into transfer arm 18 as it moves along longitudinal groove 18a formed in the bottom portion at the front end of transfer arm 18. When boat 10 has been delivered in transfer arm 18, the elevator goes down. Boat 10 is positioned along longitudinal slot 18a. Then, the elevator is withdrawn to the operator's side.

Incidentally, heat-treating furnaces are often installed in plural stages in heat-treating equipment. And, one elevator is used to transfer boats to the heat-treating furnaces.

In the conventional boat transfer methods, however, a certain type of heat-treating furnace must be used with a certain type of transfer means and a certain type of carrying mechanism of the elevator. As a result, a common elevator cannot be used for different types of heat-treating furnaces.

The current trend in the production of semiconductor devices is a shift from small-variety large-lot production to large-variety small-lot production. Under this situation, there has been a long felt need for the development of a heat-treating apparatus having heat-treating furnaces of different types.

However, the conventional boat transfer methods were unable to meet the above-mentioned need because boats cannot be transferred by a common elevator to different types of heat-treating furnaces.

SUMMARY OF THE INVENTION

The object of this invention is to provide a heat-treating method and a heat-treating apparatus capable of smoothly transferring boats to plurality of heat-treating furnaces by a common elevator.

A heat-treating apparatus according to this invention comprises a plurality of heat-treating furnaces arranged in multiple stages and boat supporting units provided near the entrances of the heat-treating furnaces; a work position, provided adjacent to the heat-treating furnaces, for receiving a boat carrying objects to be treated; an elevator for transferring said boats between the work position and a predetermined boat supporting unit; and transfer means for bringing said boats from said boat supporting units into specified ones of said heat-treating furnaces and bringing said boats back to said boat supporting units.

A heat-treating method comprising the steps of transferring, by a common elevator, boats from the work position adjacent to a heat-treating furnace to the specified boat supporting units of a plurality of said heat-treating furnaces arranged in multiple stages and boat supporting units provided near the entrances of the heat-treating furnaces vertically moving said boat supporting units to specified positions to suit the entrances of said heat-treating furnaces; transferring said boats from s id boat supporting units into the specified ones of said heat-treating furnaces by transfer means; and heat-treating the boats by heating means.

Boat supporting units of the type should preferably adopted which is equipped with a mechanism movable vertically to go to the position of the entrance of a heat-treating furnace. An example of such a lifting mechanism is one which moves up and down the boat cradle plate by means of an air cylinder on the bed plate.

Said different types of heat-treating furnaces include the diffusion furnace, CVD furnace and oxidation furnace.

As for the construction of the elevator, the elevator may comprise a sliding body provided in front the heat treating furnaces and the work position and capable of moving vertically along an array of heat-treating furnaces, a fixed arm protruding from the sliding body, a support arm mounted on the fixed arm and capable of swinging in a plane parallel with the boat mounting place on the work position, and a couple of chucks mounted, at the ends of the support arm, changeably in the distance therebetween and used to hold a boat by the ends thereof.

As transfer means, it is possible to adopt transfer means using a substantially cylindrical body having formed in the bottom part thereof a long slot which the boat supporting unit goes into and to bring a boat carrying objects to be treated into the cylindrical body.

BRIEF DESCRIPTION OF THE DRAWINGS

FIG. 7 is a perspective view showing the composition of an elevator;

FIG. 13A is an explanatory drawing showing the state of a boat just after it has been delivered to a transfer arm of the "Atmoscan" type; and FIG. 13B is an explanatory drawing showing the state of a boat which was delivered to said transfer arm and inserted into a heat-treating furnace.

DETAILED DESCRIPTION OF THE PREFERRED EMBODIMENT

An embodiment of this invention will be described with reference to the accompanying drawings.

Figure 5:
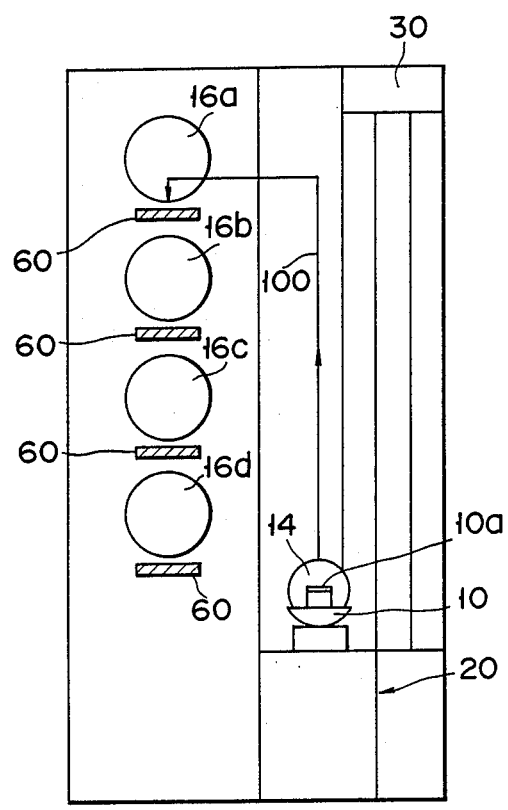
FIG. 5 is an explanatory drawing showing the composition of an embodiment of this invention.

FIG. 5 illustrates the composition of an embodiment of this invention. This heat-treating apparatus is used as a diffusion furnace, a CVD (Chemical Vapor Deposition) furnace, an oxidation furnace, etc. This heat-treating furnace comprises different types of heat-treating furnaces 16a, 16b, 16c and 16d.

Heat-treating furnace 16a is constructed as an "Atmoscan" type, heat-treating furnace 16b as a "Cantilever" type and heat-treating furnaces 16c and 16d as "Softlanding" type.

Boat delivery positions ar provided in front of the entrances of heat-treating furnaces 16a, 16b, 16c and 16d.

Boat supporting units are installed in the respective boat delivery positions.

Work position 20 is located at a lower position of the front side of the heat-treating apparatus. Boat 10 carrying a number of wafers 14 is put on work position 20.

Boat 10 put on work position 20 is then transferred to the boat delivery position of desired heat-treating furnace 16. For the transfer of boat 10, elevator 30 is used which is installed before the front side of the heat-treating apparatus such that elevator 30 can freely move up and down.

Boat 10 has a couple of boat handles 10a. Elevator 30 holds boat handles 10a by chucks 42 and 42.

FIG. 7 is perspective view showing the construction of elevator 30. Elevator 30 has mounted therein sliding body 32 which moves in the vertical direction Z-axis direction in the drawing) along guide rail 34 installed upright in the housing. On the front side of sliding body 32, there is provided fixed arm 36 protruding in the X-axis direction in the drawing).

Fixed arm 36 has mounted thereto a couple of swing arms 38 and 38 which are pivotable in a specified horizontal plane. Support arm 40 is carried by the end portions of swing arms 38 and 38. A couple of chucks 42 and 42' are attached to the ends of support arm 40. The couple of chucks 42 and 42' are capable of adjusting the distance therebetween by chuck open/close cylinders 44 as indicated by the arrows 310. Both chuck open/close cylinders 44 are contained in cylindrical support arm 40 so as to be covered without a dust. Sliding body 32 is moved vertically as Z-axis ball screw 48 is rotated by Z-axis stepping motor 46 installed at a lower position of the housing. Z-axis ball screw 48 is installed, in the housing, piercing sliding body 32.

Figure 6:
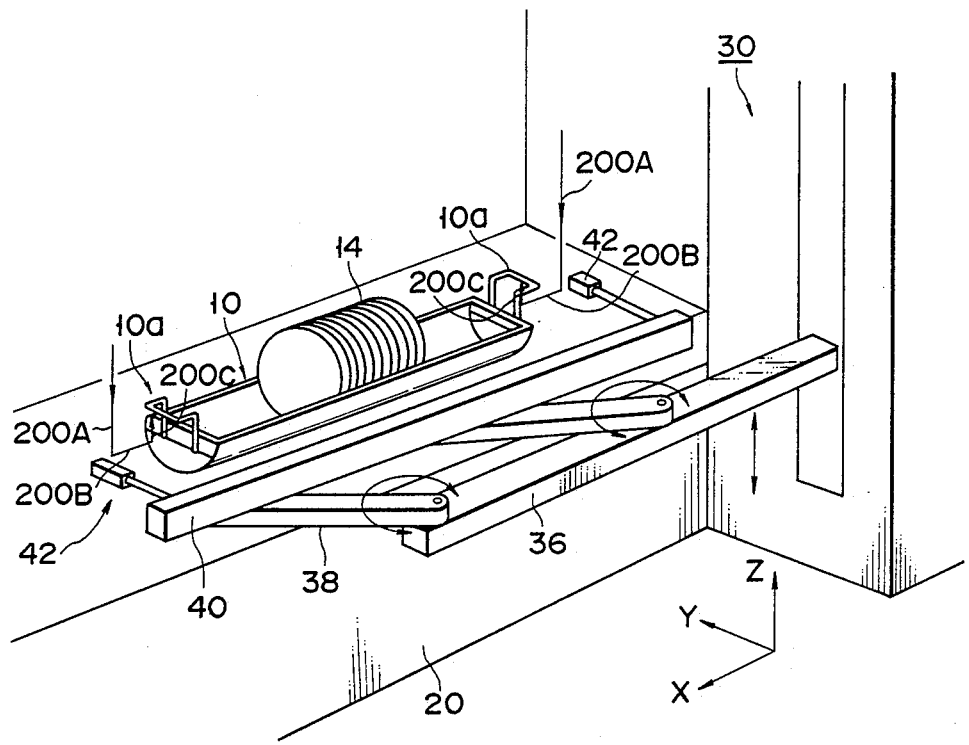
FIG. 6 is an explanatory drawing showing the state of the work position section being used.

Y-axis stepping motor 50 is installed in a lower position of sliding body 32 and has mounted thereto Y-axis ball screw 52. Y-axis ball screw 52 has screwed thereon one end each of a couple of long driving bodies 54. The opposite ends of driving bodies 54 are connected to swing arms 38. By the driving motion of Y-axis stepping motor 50, Y-axis ball screw is rotated, so that driving bodies 54 cause support arm 40 to swing in the direction as indicated by the arrows 300. By the above operation, support arm 40 is translated in the Y-axis direction. By moving chuck open/close cylinders 44, the distance between chucks 42 and 42' can be adjusted as indicated by the arrows 310. Referring to FIG. 6, description will be made of a case where boat 10, placed on work position 20, is transferred by elevator 30.

The distance between chucks 42 and 42' is widen by moving cylinders 44. Then, elevator 20 is made to go down as indicated by arrows 200A.

By moving cylinders 44 the distance between chucks 42 and 42' is narrowed as indicated by the arrows 200B and the chucks are positioned below boat handles.

By using Z-axis stepping motor 46 and chucks 42 and 42', handles 10a of boat 10 are raised as indicated by arrows 200C.

Having raised boat 10, elevator 30 transfers boat 10 to boat supporting unit 60 of desired heat-treating furnace 16 as indicated by arrow 100 in FIG. 5. Boat 10 is put on boat supporting unit 60 by a procedure which is the reversal of the above-mentioned procedure for raising the boat.

Figure 8:
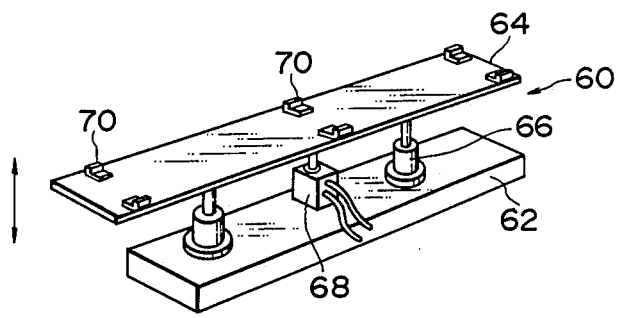
FIG. 8 is a perspective view showing the composition of a boat supporting unit.

Boat supporting unit 60 has bed plate 62 and cradle plate 64 mounted via guides 66 on bed plate 62 and movably in the vertical direction in FIG. 8. Air cylinder 68 mounted o bed plate 62 is used to move cradle plate 64 up and down in the direction shown in the drawing.

Figure 9:
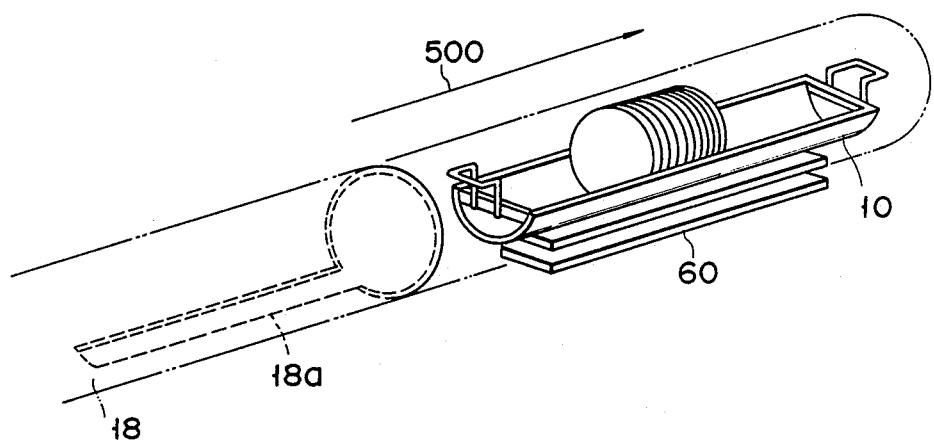
FIG. 9 is a perspective view showing a boat mounted on the boat receiving unit of FIG. 8.

A plurality of boat supports 70 made of quartz, for example, are provided on cradle plate 64. As shown in FIG. 9, boat 10 is placed on boat supporting unit 60 such that its longitudinal direction coincides with the longitudinal direction of boat supporting unit 60.

Description will now be made of a case where boat 10, placed on boat supporting unit 60, is delivered to transfer means for a heat-treating furnace in the "Atmoscan" transfer method.

Transfer means for a heat-treating furnace in the "Atmoscan" transfer method has transfer arm 18 formed in hollow cylinder as shown in FIG. 9.

Transfer arm 18 is made of a heat-resistant material such as quartz glass. Long slot 18a corresponding to the length of boat 10 is formed in the bottom portion o the open end side and along the arm moving direction as shown by the arrow 500.

Figure 10:
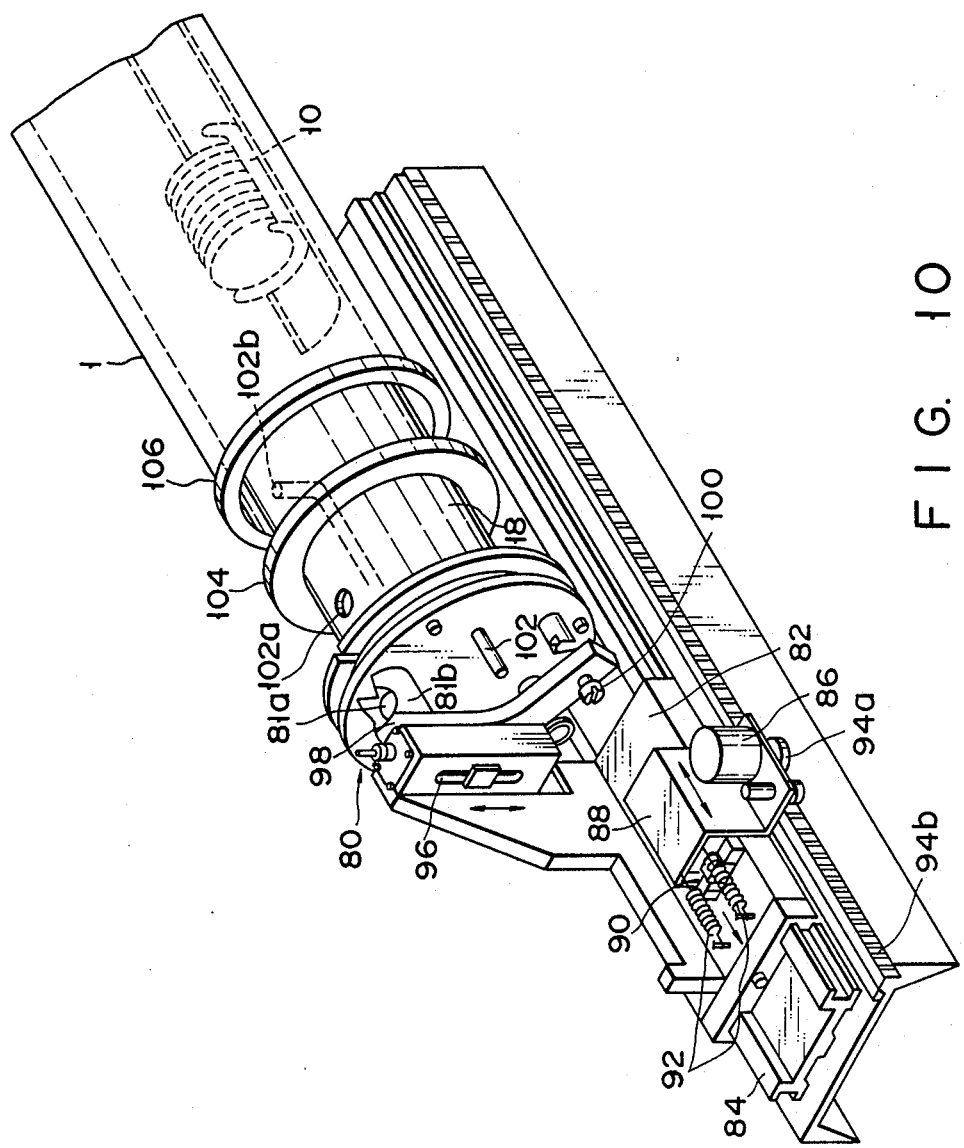
FIG. 10 is a perspective view showing a boat means for transferring a boat to a heat-treating furnace of the "Atmoscan" type.

Transfer arm 18 is, at the opposite end, mounted through arm holding part 80 to slide block 82 as shown in FIG. 10.

Slide block 82 is formed so as to be slidable on track 84 toward heat-treating furnace 16. Carriage 88 having motor 86 secured thereto is mounted on slide block 82 so that carriage 88 can move via bearing 90 in the advancing direction of the arm. A couple of springs connected to carriage 88 are fixed in a rear position of slide block 82. Slide block 82 is moved toward heat-treating furnace 16a as the rotation of motor 84 is utilized to drive slide block 82 forward by a combination of pinion 94a and rack 94b.

Using ball 81a and socket 81b, arm holding part 80 detachably supports the top end portion of the opposite end of transfer arm 18.

The height at which transfer arm 18 is supported is adjusted along vertical slot 96 formed in the upright portion of slide block 82. The inclination at which transfer arm is supported is adjusted by adjusting screws 100 provided at the legs of Y-form spider 98.

Transfer arm holding part 80 has provided therein gas introduction port 102 to introduce an inactive gas such as nitrogen gas into transfer arm 18. By this means, the inside of transfer arm 18 can be made to have the atmosphere as in heat-treating furnace 16a. The inactive gas introduced into transfer arm 18 is discharged to the outside through exhaust ports 102a and 102b.

Boat 10 is delivered from boat supporting unit 60 to transfer arm 18 as shown in FIG. 9.

In this embodiment, boat supporting units 60 are arranged along the moving paths of transfer arm 18. When boat 10 is put on boat supporting unit 60 by elevator 30, the height of boat supporting unit 60 is adjusted by air cylinder 8 to a level at which boat 10 carrying wafers 14 does not collide with advancing transfer arm 18. Under this condition, transfer arm 18 starts to advance and stops at a position where boat 10 is accommodated completely in the hollow inside of transfer arm 18.

Figure 11:
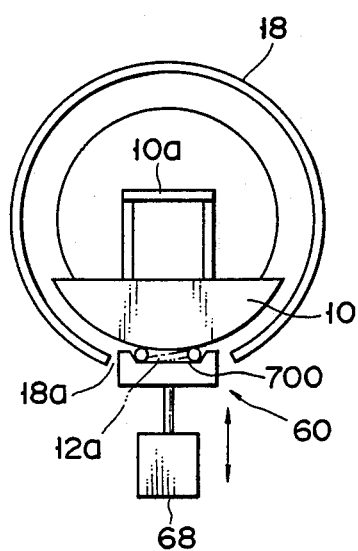
FIG. 11 is an explanatory drawing showing the state of a boat being delivered from a boat receiving unit to said boat transfer means.

Thus, boat 10 is located inside cylindrical transfer arm 18 and mounted through slot 18a on boat supporting unit 60 as shown in FIG. 11.

Figure 12:
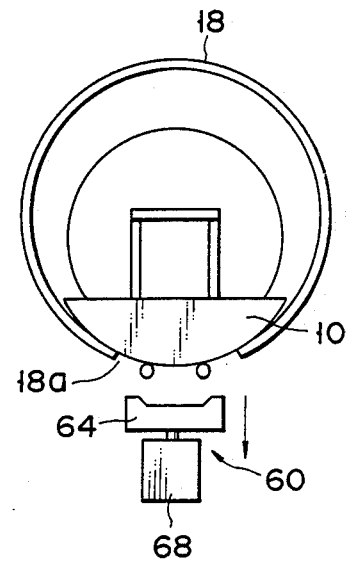
FIG. 12 is an explanatory drawing showing a boat delivered from said boat supporting unit to said boat transfer means.

When boat supporting unit 60 is lowered from the above condition, boat 10 is supported along long slot 18a by the front end portion of hollow, cylindrical transfer arm 18 as shown in FIGS. 12 and 13A. Boat 10 has thus been delivered to transfer arm 18.

After this, transfer arm 18 is made to advance to bring boat 10 into heat-treating furnace 16a as shown in FIG. 13B.

If, in the above transfer motion, flange 104 of the transfer arm collides with contact flange 106 on the side of heat-treating furnace 16a, the impact is absorbed by springs 92 provided between carriage 88 and slide block 82. Moreover, flange 104 is appropriately pressed against flange 106 by the urging force of springs 92. Consequently, the atmosphere in heat-treating furnace 16a can be kept unchanged.

According to this invention, after boat 10 is mounted on boat supporting unit 60, only by moving boat supporting unit 60 up and down, boat 10 can be delivered smoothly from boat supporting unit 60 to cylindrical transfer arm 18.

The delivery of boat 10 to the "Atmoscan" type transfer means for a heat-treating furnace has been described. Needless to say, this invention can be applied to boat delivery to other types, such as "Softlanding" and "Cantilever" types, of transfer means for heat-treating furnaces.

Figure 1A:
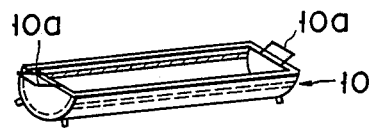
FIG. 1A is a perspective view showing a boat for use in the "Cantilever" type and "Softlanding" type transfer methods.
Figure 1B:
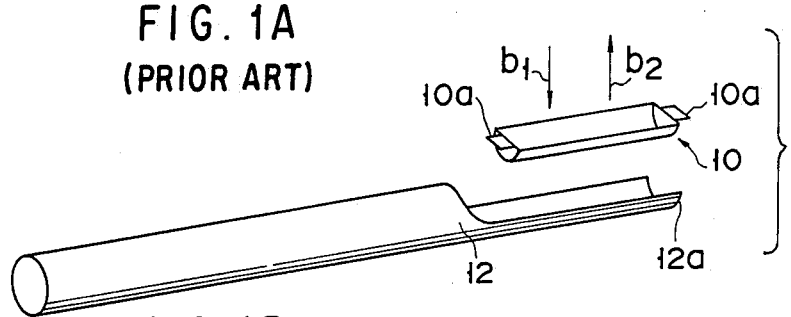
FIG. 1B is a perspective view showing a boat being mounted on a wafer transfer arm used in the "Softlanding" method.

In such cases as above, it is only necessary to form boat supporting unit 60 to provide clearance 700 for front end 12a of transfer arm 12 of FIG. 1B to enter between boat 10 and boat supporting unit 60 when boat 10 is mounted on boat supporting unit 60 as shown in FIG. 11.

Then, only by moving up and down boat supporting unit 60 on which boat 10 is mounted, boat 10 can be delivered easily from boat supporting unit 60 to transfer arm 12 of the "Cantilever" type or "Softlanding" type.

For a "Softlanding" or "Cantilever" type transfer means for heat-treating furnaces, the direct transfer of boat 10 from elevator 30 to transfer means may be done as before.

Figure 1C:
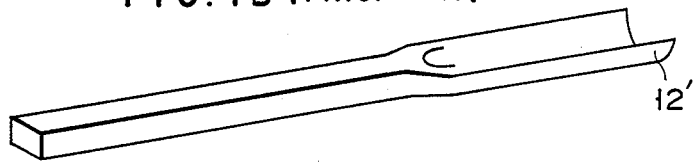
FIG. 1C is a perspective view showing an example of a wafer transfer arm used in the "Cantilever" method.
Figure 2:
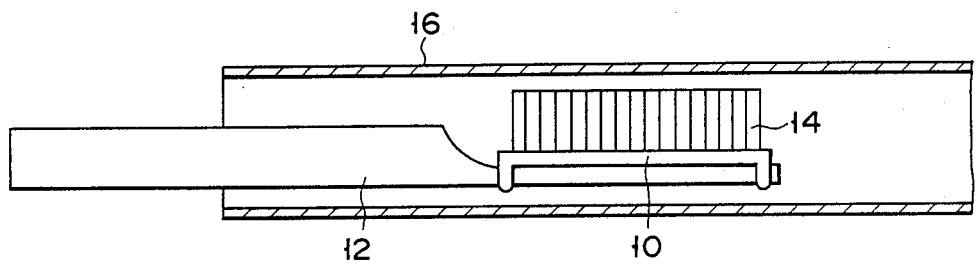
FIG. 2 is a cross-sectional view showing a boat brought into a heat-treating furnace by the "Softlanding" method.
Figure 3:
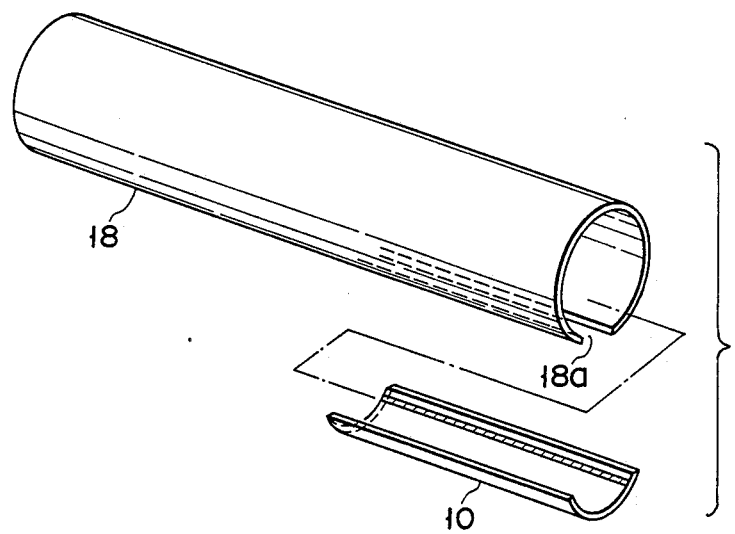
FIG. 3 is a perspective view showing a transfer arm and a boat used in the "Atmoscan" method.
Figure 4A:
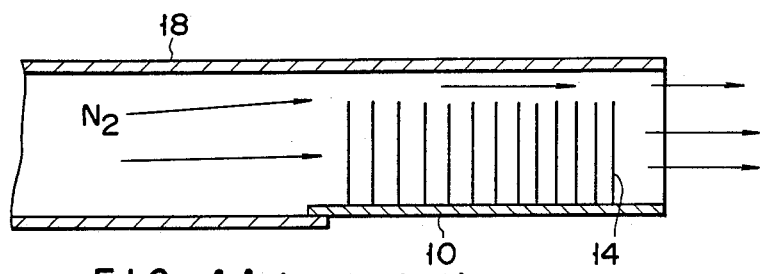
FIG. 4A. is a cross-sectional view showing a boat brought into the transfer arm of FIG. 3.
Figure 4B:
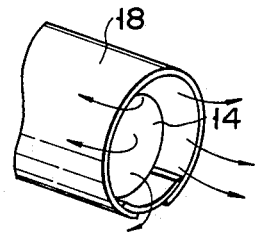
FIG. 4B/is a perspective view showing an inactive gas coming out of the transfer arm of FIG. 4A.

According to this invention, when different types of heat-treating furnaces 16a, 16b, 16c and 16d are provided as shown in FIG. 1, you have only to install boat supporting unit 60 at the boat delivery position of an "Atmoscan" type heat-treating furnace. This makes it possible to simplify the construction of the whole apparatus.

As described above, according to this invention, even when different types of heat-treating furnaces 16a, 16b, 16c and 16d are provided in multiple stages, it is possible to transfer boat 10 carrying wafers 14 to the delivery positions of various heat-treating furnaces by using common elevator 30 and deliver the boat to the transfer means of the heat-treating furnaces.

According to this invention, elevator 30 has only to put boat 10 it has transferred on boat supporting unit 60 and can proceed to the next boat transfer operation. This ensures a very efficient transfer of boats.

This invention has particularly effective applications in heat-treating apparatuses having different types of furnaces. This invention can also be applied to heat-treating apparatuses having furnaces of the same type arranged in multiple stages.

The above embodiment of this invention has been described using swing-type elevator 30. However, this invention is not limited to this application and an elevator having a mechanism capable of moving along the X, Y and Z axes may be used.

In the above embodiment of this invention, air cylinder 68 was used as the lifting means for boat supporting unit 60. However, other types of lifting means may be used as necessity requires.

What is claimed is:

1. A heat-treating apparatus, comprising:
   a plurality of heat-treating furnaces arranged in multiple stages and boat supporting units installed near the entrances of the heat-treating furnaces;
   a work position, provided adjacent to the heat-treating furnaces, for receiving a boat carrying objects to be heat-treated;
   an elevator for transferring said boats between said work position and a predetermined said boat supporting unit; and
   transfer means having a substantially cylindrical body to accomodate a boat carrying objects to be treated and a long slot, formed in the bottom part of said substantially cylindrical body, through which said boat supporting unit comes in and goes out for bringing said boats from said boat supporting units into specified ones of said heat-treating furnaces and bringing said boats back to said boat supporting units.

2. A heat-treating apparatus according to claim 1, wherein said boat supporting units have lifting mechanism to adjust the height thereof to suit the positions of the entrances of said heat-treating furnaces.

3. A heat-treating apparatus according to claim 2, wherein said lifting mechanisms each have mounted on the bed plate an air cylinder to move up and down a cradle plate for a boat.

4. A heat-treating apparatus according to claim 1, wherein said different types of heat-treating furnaces are a diffusion furnace, a CVD furnace and an oxidation furnace.

5. A heat-treating apparatus according to claim 1, wherein said elevator comprises a sliding body provided in front of said heat-treating furnaces and said work position and capable of moving vertically along an array of heat-treating furnaces, a fixed arm protruding from said sliding body, a support arm mounted on said fixed arm and capable of swinging in a plane parallel with the boat mounting place on said work position, and a couple of chucks mounted, at the ends of said support arm, changeably in the distance therebetween and used to hold said boat by the ends thereof.

* * * * *

UNITED STATES PATENT AND TRADEMARK OFFICE
CERTIFICATE OF CORRECTION

PATENT NO. : 4,954,079
DATED : September 4, 1990
INVENTOR(S) : Kenichi Yamaga

It is certified that error appears in the above-identified patent and that said Letters Patent is hereby corrected as shown below:

On the title page item [21] Appl. No.: "395,645" should read --305,645--.

Signed and Sealed this

Seventh Day of April, 1992

Attest:

HARRY F. MANBECK, JR.

*Attesting Officer*      *Commissioner of Patents and Trademarks*